United States Patent
Barmatz et al.

(10) Patent No.: US 6,809,305 B2
(45) Date of Patent: Oct. 26, 2004

(54) MICROWAVE BONDING OF THIN FILM METAL COATED SUBSTRATES

(75) Inventors: Martin B. Barmatz, La Crescenta, CA (US); John D. Mai, So. Pasadena, CA (US); Henry W. Jackson, La Verne, CA (US); Nasser K. Budraa, Riverside, CA (US); William T. Pike, London (GB)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 10/064,500

(22) Filed: Jul. 22, 2002

(65) Prior Publication Data

US 2004/0011783 A1 Jan. 22, 2004

(51) Int. Cl.[7] .................................................. H05B 6/64
(52) U.S. Cl. ........................ 219/678; 219/679; 428/594
(58) Field of Search ................................ 219/678, 679, 219/680, 686, 702, 121.41, 121.43; 156/89.11, 89.12, 292, 273.3, 345.51–345.53, 345.48; 118/723 I, 50.1; 428/343, 594; 438/105; 257/706, 758, 778

(56) References Cited

U.S. PATENT DOCUMENTS

| 6,024,822 | A | * | 2/2000 | Alper et al. ............. 156/273.3 |
| 6,054,693 | A | * | 4/2000 | Barmatz et al. ............ 219/678 |
| 6,337,513 | B1 | * | 1/2002 | Clevenger et al. .......... 257/706 |
| 6,410,415 | B1 | * | 6/2002 | Estes et al. ................. 438/612 |
| 6,485,785 | B1 | * | 11/2002 | Mino et al. ................. 427/352 |
| 6,531,232 | B1 | * | 3/2003 | Baleras et al. ............. 428/594 |
| 6,548,375 | B1 | * | 4/2003 | De Los Santos et al. ... 438/455 |
| 6,558,494 | B1 | * | 5/2003 | Wang et al. ................ 156/109 |
| 6,607,969 | B1 | * | 8/2003 | Kub et al. .................. 438/458 |

* cited by examiner

*Primary Examiner*—Quang T Van
(74) *Attorney, Agent, or Firm*—Fish & Richardson P.C.

(57) ABSTRACT

Bonding of materials such as MEMS materials is carried out using microwaves. High microwave absorbing films are placed within a microwave cavity containing other less microwave absorbing materials, and excited to cause selective heating in the skin depth of the films. This causes heating in one place more than another. This thereby minimizes unwanted heating effects during the microwave bonding process.

35 Claims, 3 Drawing Sheets

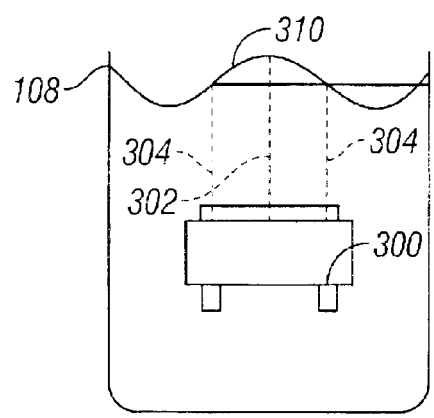
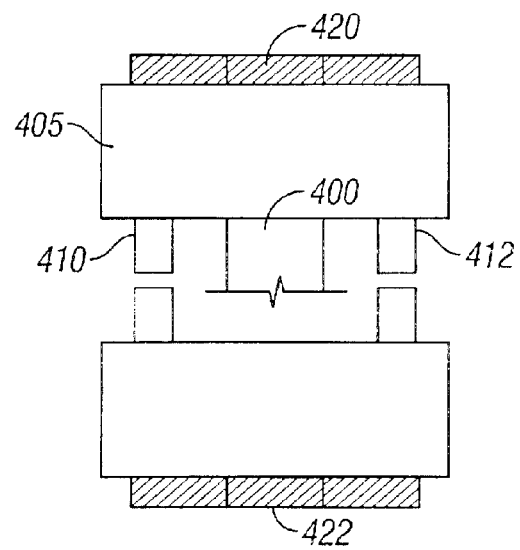
FIG. 3      FIG. 4
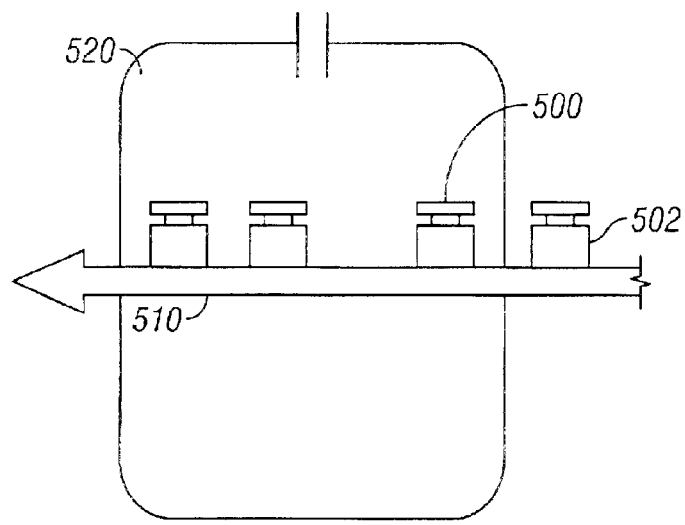
FIG. 5

MICROWAVE BONDING OF THIN FILM METAL COATED SUBSTRATES

CROSS REFERENCE TO RELATED APPLICATIONS

This application claims benefit of U.S. Provisional Application No. 60/130,842, filed Apr. 22, 1999, and is a continuation-in-part of 60/198,911, filed Apr. 20, 2000.

FEDERAL RESEARCH STATEMENT

The U.S. Government may have certain rights in this invention pursuant to Grant No. 7-1407 awarded by NASA.

BACKGROUND OF INVENTION

Various structures require two separated parts to become bonded. For example, substrates may need to be bonded in many different scientific, technological and industrial applications. There still remain certain issues in the standard techniques for bonding various substrates. For example, conventional techniques of bonding substrates may lead to residual stresses left behind in the bonding process. Moreover, the bonding process may lead to limits in the maximum operating temperatures of the bonded materials. This can be difficult since too much heat can overheat and destroy delicate components. That in turn may weaken the substrates, or may undesirably diffuse bonded materials into the substrates. Finally, small size bonding techniques may be difficult.

SUMMARY OF INVENTION

The present application teaches bonding structures using the selective heating feature of microwave energy. A low temperature, low pressure wafer bond, can be effected. According to the present system, first and second substrates may be bonded. The first substrate material has a first surface material part and the second substrate material has a second surface material part. The two parts are aligned. Microwave energy is applied to selectively heat the material parts in order to bond the first substrate to the second substrate. The substrates can be any material that is a poor absorber of microwaves, while the substrate surface material can be any material that is a better absorber of microwaves than the substrate. For example, the substrates may be insulators, semiconductors or the like, while the substrate surface material can be a metal.

BRIEF DESCRIPTION OF DRAWINGS

These and other aspects will now be described in detail with respect to the accompanying drawings, wherein:

FIG. 3 shows a system for correcting for non-uniform heating;

FIG. 4 shows a heating protection element for a wafer;

FIG. 5 shows a high speed bonding system;

DETAILED DESCRIPTION

Microwave heating involves the conversion of electromagnetic energy into heat. Microwave power is attenuated as the fields penetrate materials. This leads to heating of the material within its "skin depth". The skin depth is defined as the distance required for the power to be reduced to $1/e^{TH}$, where e is 2.718, of the initial value at the surface.

The loss factor of a material in a microwave field represents how much of the microwave field energy will be absorbed by the material, and hence is directly related to how much heating of the material will be caused by the microwave absorption.

The loss factor for metals is very large compared to the loss factor in almost all other materials. Metals also have a skin depth of 0.05 to 5 microns, for example. Thin metal films hence absorb significant amounts of microwave energy. The small mass and small heat capacity of these thin metal films cause their temperature to rise rapidly based on the absorbed microwave power.

The present application discloses a way of bonding substrates using films such as a metal film with a large imaginary dielectric constant $\epsilon''$. Microwave energy causes significant heating predominantly within the skin depth of such films.

This selective heating causes the material within the skin depth of the metal film to be heated more than the parts of the metal film that are not within the skin depth. This can be very useful when bonding together materials in which the metal films are thin, e.g., of comparable thickness to the skin depth, e.g., within an order of magnitude of the thickness of the skin depth. The films can be typically less than 10 μm, and excellent effects are obtained when the films are less than 1 μm.

The metal is typically attached to a substrate, e.g., a silicon substrate. The silicon substrate may include semiconductor materials, e.g. materials which can be sensitive to heat.

Figure 1:
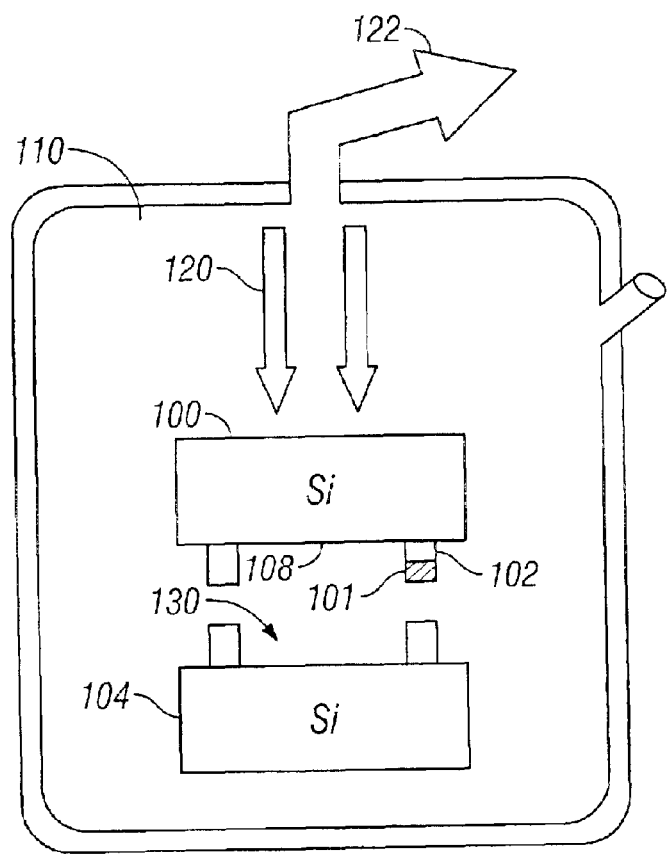
FIG. 1 shows a view of silicon substrates in a chamber.

An embodiment is shown in FIG. 1. This embodiment discloses bonding of two silicon substrates, each with two metal films, to each other. The two silicon substrates each have a surface, with a first surface of the first silicon substrate facing a second surface of the second silicon substrate. A metal film is on each of the first and second surfaces. The metal film of one of the silicon substrates will be bonded to the metal film of the other of the silicon substrates.

The metal is a high $\epsilon''$ material while the silicon substrate is a low $\epsilon''$ material. A micro electrical mechanical system, or MEMS device to be bonded is placed in a single mode microwave cavity 110. Microwave radiation 120 is introduced into the cavity 110 to produce a resonant condition that leads to high intensity microwave fields. The microwave radiation 120 selectively heats the material's position in the region of the high field intensity. Most of the heating effect from the microwaves is deposited in the skin depth 101 of the metal 102. Note that the skin depth can be smaller or larger than the thickness of the metal film. This effectively concentrates the deposition energy in that skin depth, causing the thin metal film to rapidly heat and if desired to melt. Bonding occurs relatively quickly, with minimal heating of the substrate 104. Of course, the substrate 104 is heated in the area 108 near the metal 102 when the heat escapes from the heated metal. However, heating in the area 108 will generally be minimal due to the speed of the heating process and the large heat capacity of the substrate 104.

Moreover, the bonding process time can be short, allowing for reduced diffusion of heat from the metallization 102 into the silicon 104.

The microwave bonding can be carried out with no pressure or low pressure between the substrates. This means that mechanically-induced stresses can be minimized.

As shown in FIG. 1, micromachining techniques may form a small cavity 130, e.g. of 0.1 to 8 microns in size. By surrounding this cavity with a continuous metal film, the heating can hermetically seal the cavity. This technique can lead to leak rates equal to or better than $3 \times 10^{-9}$ STP-cc/s. The microwave cavity 110 can be evacuated or the substrates to be bonded can be within a vessel such as a quartz tube, that is evacuated to form a vacuum around the substrates during bonding.

This technique allows bonding using microwave heating only, requiring no pressure in the bonding area beyond the weight of the substrate connections. Furthermore, in a vacuum environment, hermetic seals can be formed where the pressure in the hermetic sealed cavity would not return to atmospheric for over one year.

Figure 2:
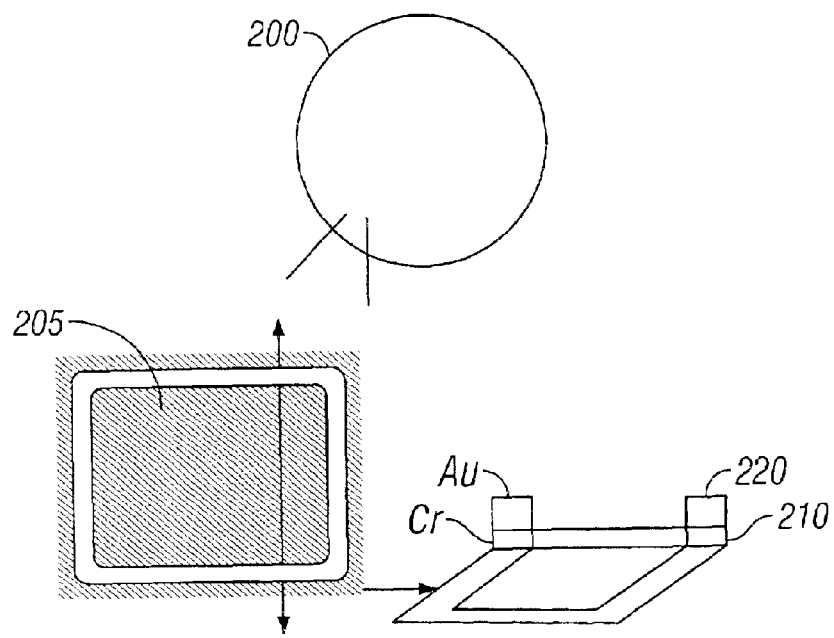
FIG. 2 shows a view of a silicon wafer.

The present application uses a system disclosed herein. Two four-inch silicon wafers are used although any wafers between ¼ inch and 4 inches can be used. One of those wafers is shown as 200 in FIG. 2. A mask of photoresist 205 is provided to lithographically define a concentric square bond area. 150 Å of chromium is deposited as a first layer 210, followed by deposition of 1200 Å (0.12 $\mu$m) of gold as a second layer 220. The remaining photoresist 205 is then lifted off.

The wafer is etched in a solution of ethylenediamene+ pyrocathecol ("EDP") for about 80 minutes.

This produces pits of approximately 3 mm×100 $\mu$m deep. The pits are surrounded by a 2 mm wide plateau of gold on all sides.

If multiple parts are formed on the wafer, the wafer can then be diced to form separated parts (100/104) shown in FIG. 1.

Microwave bonding is carried out, as shown in FIG. 1, in a cylindrical cavity 110 that may be excited by an azimuthally symmetric $TM_{010}$ mode at 2.45 GHz by a microwave source 122. The cavity can have a 12.7 centimeter diameter. The loaded Q of the empty cavity may be approximately 2500.

The first substrate 100 is simply placed on top of the second substrate 104 so that the deposited film patterns overlay. Microwave energy is applied in order to fuse the matching metallic parts on the two substrates. The high vacuum within the cavity in many cases is desired in order to form a vacuum within the cavity 130. This vacuum can also avoid the formation of an undesirable plasma during the bonding process.

The only pressure applied comes from the wafer's weight. However, if desired, an additional low-microwave absorbing material, such as sapphire, can be placed above the upper wafer to increase the pressure or a rod can be used to produce additional pressure. The wafers are aligned with each other so that the metal bonding films on each wafer are adjacent to each other.

The wafers are optimally placed at the area of the highest magnetic field intensity in the cavity corresponding to the mode of excitation, and are oriented so their surfaces are parallel to the magnetic field.

Different power-time profiles can be used. Some of these are high power and short times, e.g. a 300 watt pulse for approximately 2–3 seconds. Others use the opposite, e.g., approximately 30 seconds at 100 watts or less. Different time-power profiles can be used with different materials and substrate sizes and position in the cavity.

The ability to maintain a hermetic seal in the cavity for over a year has been demonstrated. Moreover, since the cavity can be formed within silicon, it can be small, e.g. less than 5 $\mu$m in diameter, more preferably less than 1 $\mu$m. This small size may be desirable for MEMS devices.

The above has disclosed bonding MEMS wafers together and forming hermetically sealed enclosures using a single mode microwave cavity. The concentration of the heat on the metal films join the two surfaces together without the need for external pressure. The substrate temperature rises only slightly and due mostly to heat being transferred (thermally conducted away from the metal films). Metal diffusion into the silicon substrates is relatively limited because of the short time required for the bonding.

Different combinations of substrates and metallic layers, such as platinum-titanium, copper, aluminum are contemplated. Other non-metallic, but highly microwave absorbing materials (such as certain ceramics) can also be used.

Figure 7:
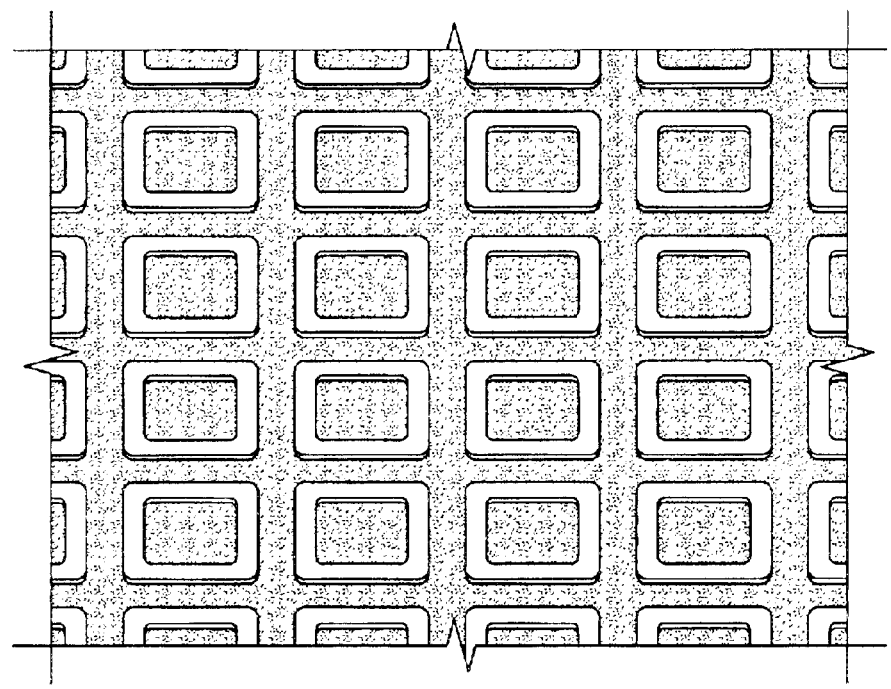
FIG. 7 shows some exemplary formed substrates with gold perimeters on a silicon substrate.

An embodiment may use a cylindrical cavity that is excited in a sinusoidal, fully symmetric $TM_{010}$ mode at 2.45 gigahertz under vacuum of around 25$\mu$ Torr to avoid the creation of plasma. Substrates may be used that have a gold metal on a silicon substrate. The substrates may be fabricated using standard lithographic techniques. Each device may be 5 mm by 5 mm by 500 microns. A 10 micron Gold/silicon layer may be used with a chromium diffusion barrier between the gold and the silicon. A chromium diffusion barrier may prevent the formation of a Au—Si eutectic that may have weakened mechanical properties. FIG. 7 shows the wafers including a perimeter of gold on the silicon wafers, which are later sealed to form the cavities.

Since the loss tangent for microwaves is much higher in the metal than it is for silicon, most of the microwave energy is deposited in the metallic portion of the substrate. The metal film is thin, and hence this energy will quickly locally melt the metal and bond the metal to metal. Since this happens very quickly, the process will minimally heat the substrate. The cavity may be formed within that outer perimeter, and will have a similar vacuum to the vacuum of the ambient (here around 25$\mu$ torr). Tests have shown a leak rate from the cavity on the order of $3 \times 10^{-9}$ STP-cc/s.

Another embodiment is shown in FIG. 3. If the sample 300 is very large, e.g., greater than 10% of the size of the microwave wavelength 310, then the microwaves may actually induce a heat gradient along the substrate. For example, the microwaves may have a sinusoidal shape in the cavity shown as sinusoid 310. This would mean that the heating effect would be greatest at the area 302, and somewhat less at the area 304. A heat conducting plate 320 is added to the top of the silicon wafer 300. The heat plate 320 can be made of, for example, a sapphire material.

This system can avoid the uneven heating effect which otherwise could not be avoided no matter where the sample was placed in the cavity.

Another embodiment shown in FIG. 4 recognizes that some materials may actually require one or more electronic components such as a transistor and/or electrical leads shown as 400 on the silicon wafer 405. The system preferentially heats the metallizations 410, 412. The microwave heating may also heat the circuitry 400, especially if the circuitry 400 includes metal. This system places at least one shield element 420, 422 on the substrate surface so as to block the microwave energy from penetrating the substrate and heating the component 400. This shield should cover at least ⅔ of the surface. This shield element can reduce, at least somewhat, the heating effect of the microwave energy.

An automation system is shown in FIG. 5. A number of samples, 500, 502 are placed on a conveyor element 510.

The conveyor element can be a set of non metallic support wires or a belt for example. The conveyor element takes each of the samples into the microwave area 520, and irradiates them with microwaves while they are in the area. After the irradiation, the samples can be removed from the area by moving the conveyor element.

Items can be loaded onto the conveyor 510 in advance. If vacuum is desired, the entire operation shown in FIG. 5 can actually be within a vacuum.

Figure 6:
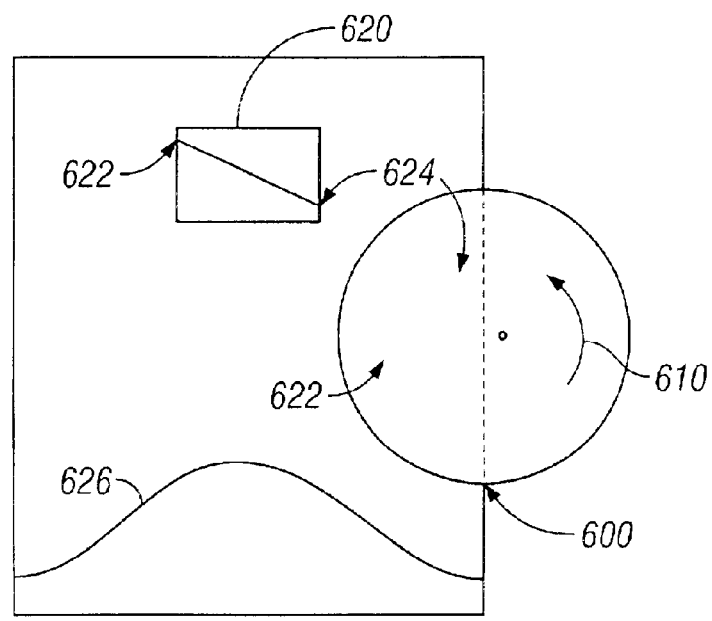
FIG. 6 shows a system for processing a large sized wafer.

FIG. 6 shows a system in which two wafers to be bonded are inserted into the chamber through a slit 600 in the chamber. The wafers are round and are rotated together, as shown by the arrow 610. Each portion of the wafer that enters the chamber is heated during the time it is in the chamber. This allows simultaneous bonding at multiple positions on larger wafers in a relatively small chamber.

According to a particular embodiment, the metallization at various positions is formed using metals of varying melting points, see 620 showing the metal melting temperature versus distance from the chamber wall. The material towards the outer edge of the wafers 622 has a higher melting point, while the material towards the center of the wafers 624 has a lower melting point. The microwave energy may follow the curve 626 shown in FIG. 6. Therefore, more microwave energy is presented at the area 622 and less at the area 624.

Other modifications are contemplated. For example, a stack of multiple substrates could be bonded.

What is claimed is:

1. A method comprising:
    placing a first substrate with a first metal surface part that has better microwave absorption than said first substrate, against a second substrate with a second metal surface part that has better microwave absorption than said second substrate,
    aligning said first surface part with said second surface part; and
    applying microwave energy to the first and second surface parts to bond the first substrate to the second substrate.

2. A method as in claim 1, wherein said first substrate has an outer surface part formed of a material with a high imaginary dielectric constant e".

3. A method comprising:
    placing a first substrate with a first surface part that has better microwave absorption than said first substrate, against a second substrate with a second surface part that has better microwave absorption than said second substrate;
    aligning said first surface part with said second surface part; and
    applying microwave energy to the first and second parts to bond the first substrate to the second substrate; and
    wherein the first substrate is placed on top of the second substrate, and is held only by gravity during bonding.

4. A method as in claim 3, wherein said first and second surface parts are metals.

5. A method as in claim 4, wherein said first substrate is poorly microwave absorbing silicon.

6. A method comprising
    placing a first substrate with a first surface part that has better microwave absorption than said first substrate, against a second substrate with a second surface part that has better microwave absorption than said second substrate;
    aligning said first surface part with said second surface part; and
    applying microwave energy to the first and second parts to bond the first substrate to the second substrate; and
    wherein said bonding includes hermetically sealing a cavity.

7. A method as in claim 6, wherein said first and second surface parts each extend around a closed perimeter, and wherein said hermetically sealing comprises hermetically sealing along an entirety of said closed perimeter.

8. A method, comprising:
    forming a first substrate having a poorly microwave absorbing material at a first portion and a thin film of better absorbing metal material at a second portion;
    forming a second substrate having a poorly microwave absorbing material having a material at a first portion, and a thin film of better absorbing metal material at a second portion; and
    using microwave energy to bond the thin films.

9. A method, comprising:
    forming a first substrate having a poorly microwave absorbing material at a first portion and a thin film of better absorbing material at a second portion;
    forming a second substrate having a poorly microwave absorbing material, having a material at a first portion, and a thin film of better absorbing material at a second portion; and
    using microwave energy to bond the thin films; and
    wherein said first substrate is held on the second substrate by gravity only.

10. A method as in claim 9, wherein the first substrate includes an indented portion therein, and said bonding comprises hermetically sealing around a perimeter of the indented portion.

11. A method, comprising:
    placing a first substrate of a first material, having a first area defined within a perimeter of a second material, against a second substrate, of the third material, said second substrate also having a second area defined within a perimeter of a fourth material, and wherein said first and third materials are poorer absorbers of microwaves than said second and fourth materials; and
    applying microwaves to an area of said first substrate and said second substrate to bond said second material to said fourth material.

12. A method as in claim 11, wherein said first and third materials are semiconductor materials.

13. A method as in claim 12, wherein said second and fourth materials are metal materials.

14. A method as in claim 13, wherein said second and fourth materials are gold.

15. A method as in claim 11, wherein said second and fourth materials define a perimeter with a closed shape.

16. A method as in claim 15, further comprising forming a hermetically sealed cavity within said perimeter.

17. A method as in claim 11, wherein said placing comprises placing one of said substrates on the top of the other of said substrates.

18. A method as in claim 17, wherein said one and said other substrates are held together only by gravity during said bonding.

19. A method as in claim 17, wherein said one and said other substrates are held together by an additional weight.

20. A method as in claim 19, wherein said additional weight is sapphire.

21. A method as in claim 17, wherein said placing includes aligning said first and second materials.

22. A device, comprising:
a first substrate of a material that is a poor absorber of microwaves, having a first surface that includes a metal that is a better absorber of microwave;
a second substrate of a material that is a poor absorber of microwaves, having a second surface that includes a metal that is a better absorber of microwaves that is aligned with the first surface;
said first and second surfaces, coupled together to define an area of connection therebetween.

23. A device as in claim 22, wherein said area of connection forms a closed perimeter.

24. A device, comprising:
a first substrate of a material that is a poor absorber of microwaves, having a first surface that is a better absorber of microwaves;
a second substrate of a material that is a poor absorber of microwaves, having a second surface that is a better absorber of microwaves that is aligned with the first surface;
said first and second surfaces, coupled together to define an area of connection therebetween; and
wherein said material of said first substrate is semiconductor material.

25. A device, comprising:
a first substrate of a material that is a poor absorber of microwaves, having a first surface that is a better absorber of microwaves;
a second substrate of a material that is a poor absorber of microwaves, having a second surface that is a better absorber of microwaves that is aligned with the first surface;
said first and second surfaces, coupled together to define an area of connection therebetween; and
wherein said first and second surfaces are metals.

26. A device, comprising:
a first substrate of a material that is a poor absorber of microwaves, having a first surface that is a better absorber of microwaves;
a second substrate of a material that is a poor absorber of microwaves, having a second surface that is a better absorber of microwaves that is aligned with the first surface;
said first and second surfaces, coupled together to define an area of connection therebetween, and
wherein said first and said second surfaces each includes a metal, said metal has a thickness within an order of magnitude of the skin depth of the first and second surfaces.

27. A device, comprising:
a first substrate of a material that is a poor absorber of microwaves, having a first surface that is a better absorber of microwaves;
a second substrate of a material that is a poor absorber of microwaves, having a second surface that is a better absorber of microwaves that is aligned with the first surface;
said first and second surfaces, coupled together to define an area of connection therebetween;
wherein said first and said second surfaces each includes a metal, said metal has a thickness within an order of magnitude of the skin depth of the first and second surfaces;
wherein said area of connection forms a closed perimeter; and
wherein said closed perimeter defines a hermetically sealed chamber.

28. A device as in claim 27, wherein said hermetically sealed chamber holds a vacuum relative to the surround environment.

29. A method, comprising:
bringing a first semiconductor substrate with a first metal film into contact with a second semiconductor substrate with a second metal film, where both said first and second metal films are less than an order of magnitude thicker than the skin depth of the metal; and
applying microwaves to said first and second semiconductor substrates to bond said first metal film to said second metal film.

30. A method wherein as in claim 29, wherein said applying microwaves comprise applying microwave in a cylindrical cavity which is excited by a microwave source at the resonant frequency of a TM010 mode.

31. A method as in claim 29, wherein said first and second metal films form one or more closed perimeters, and said applying microwaves carries out bonding of said first and second metal films in a way that forms a cavity within said first and second metal film.

32. A method as in claim 31, wherein said applying microwaves comprise applying microwaves within a chamber, and further comprising forming a vacuum within said chamber, to form a vacuum within said cavity after bonding.

33. A method as in claim 29, wherein at least one of said first and second substrates include electronic components thereon.

34. A method as in claim 33, further comprising shielding said electronic components prior to said applying microwaves.

35. A method as in claim 29, further comprising placing a plurality of samples on a conveyor, and taking said samples into an area of microwave fields.

* * * * *